United States Patent
Song et al.

(10) Patent No.: US 9,678,120 B2
(45) Date of Patent: Jun. 13, 2017

(54) ELECTRICAL LOAD IDENTIFICATION USING SYSTEM LINE VOLTAGE

(71) Applicant: Intel Corporation, Santa Clara, CA (US)

(72) Inventors: James Y. Song, Portland, OR (US); Tomm V. Aldridge, Olympia, WA (US); Pranav K. Sanghadia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/142,767

(22) Filed: Dec. 28, 2013

(65) Prior Publication Data

US 2015/0185258 A1    Jul. 2, 2015

(51) Int. Cl.
  *H04L 12/10* (2006.01)
  *G01R 29/00* (2006.01)
  *G01R 19/25* (2006.01)
  *G01R 21/133* (2006.01)
  *G06Q 50/06* (2012.01)

(52) U.S. Cl.
  CPC ....... *G01R 19/2513* (2013.01); *G01R 21/133* (2013.01); *G06Q 50/06* (2013.01)

(58) Field of Classification Search
  CPC ...... H04L 12/10; H02J 13/0079; Y04S 20/38; Y04S 20/40; Y04S 10/22; G01R 29/00; G06F 17/16
  USPC .......................................................... 324/76
  See application file for complete search history.

(56) References Cited

U.S. PATENT DOCUMENTS

| | | | |
|---|---|---|---|
| 5,483,153 A * | 1/1996 | Leeb et al. | 324/76.12 |
| 2009/0072985 A1* | 3/2009 | Patel | H04B 3/544 340/657 |
| 2010/0070217 A1 | 3/2010 | Shimada et al. | |
| 2012/0072389 A1 | 3/2012 | Aldridge et al. | |
| 2013/0066479 A1* | 3/2013 | Shetty et al. | 700/295 |
| 2013/0138651 A1* | 5/2013 | Lu et al. | 707/737 |
| 2013/0191103 A1* | 7/2013 | Chu et al. | 703/14 |

FOREIGN PATENT DOCUMENTS

| | | |
|---|---|---|
| CN | 2553384 Y | 5/2003 |
| CN | 201829927 U | 5/2011 |
| CN | 103460553 A | 12/2013 |

OTHER PUBLICATIONS

Office Action and Search Report for Chinese Patent Application No. 201410857947.4, mailed Oct. 8, 2016, 27 pages including 17 pages of English translation.

* cited by examiner

*Primary Examiner* — Son Le
*Assistant Examiner* — Akm Zakaria
(74) *Attorney, Agent, or Firm* — Jordan IP Law, LLC

(57) ABSTRACT

Methods and systems may provide for receiving a set of voltage samples corresponding to a line voltage of a leg in an electrical system and conducting a time domain analysis to identify one or more loads in the electrical system. Additionally, the time domain analysis may be used to identify one or more loads in the electrical system. In one example, conducting the time domain analysis involves classifying events with respect to cross correlation, shape magnitude, transient amplitude, transient duration, run delta and/or standard deviation.

13 Claims, 3 Drawing Sheets

| | Amplitude (%) | Duration (ms) | Shape | Legs |
|---|---|---|---|---|
| HVAC compressor | 4.8 | 240.9 | | 2-3 |
| Two stage resistive load | 0.65 | 741.7 | | 2 |
| Resistive and inductive load | 0.45 | 24.1 | | 2 |
| Refrigeration load | 1.72 | 321.2 | | 1 |

ELECTRICAL LOAD IDENTIFICATION USING SYSTEM LINE VOLTAGE

BACKGROUND

Technical Field

Embodiments generally relate to load analysis in electrical systems. More particularly, embodiments relate to using time domain analysis of system line voltage to identify, classify and distinguish between electrical loads.

Discussion

Electrical load analysis may be used to monitor the operation of devices, appliances and equipment connected to the electrical systems of buildings, residences, and other facilities. Current sensing solutions may involve installing either a current transformer in the main circuit breaker or numerous smaller in-line current sensors at the point of connection of each load to the system. Due to safety concerns, the current transformer installation may require skilled electricians and a complete shutdown of the electrical system. Moreover, the in-line current sensor installations may be time consuming, costly and complex to manage, particularly if many loads are being monitored. While recent developments may have been made with regard to voltage and current monitoring of electrical loads, there remains considerable room for improvement. For example, conventional voltage sensing solutions may require complex frequency domain analysis (e.g., harmonics analysis at very high bit resolutions and data frequency) in order to achieve reliable results.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Figure 1:
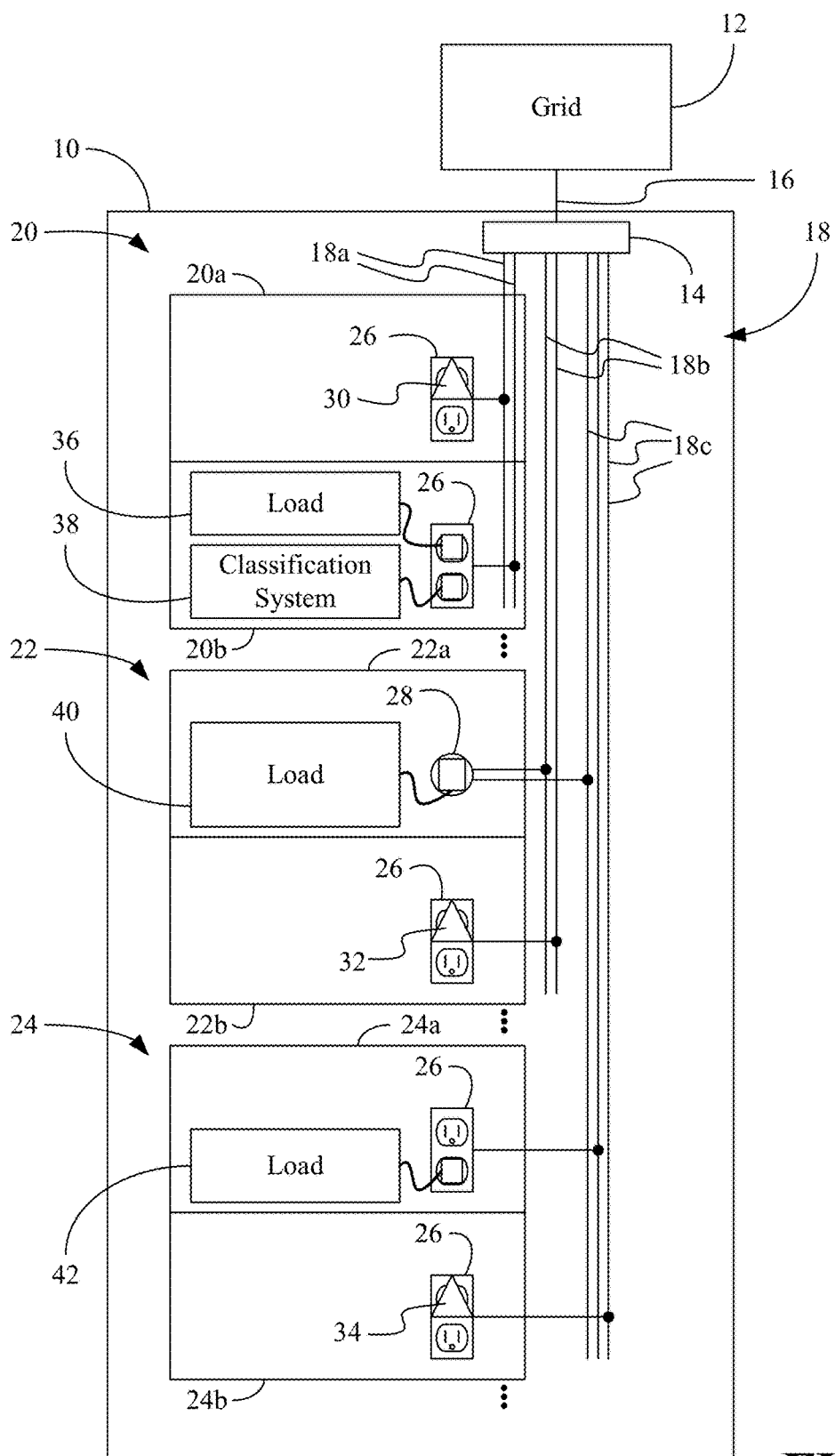
FIG. 1 is an illustration of an example of a facility having a load classification system according to an embodiment.

FIG. 1 shows a facility 10 such as, for example, a building, residence or other area having an electrical system that is powered by an electrical grid 12 (e.g., utility, transmission lines, etc.). The illustrated facility 10 includes a main circuit breaker 14 that receives AC (alternating current) power from a main line 16 connected to the electrical grid 12 and provides that power to various locations of the facility 10 in the form of a plurality of voltage legs 18 (18a-18c). For example, outlets 26 (e.g., 120V receptacles) in a first set of rooms 20 (20a, 20b) of the facility 10 may receive a first leg 18a of the AC power. Additionally, an outlet 26 in a second set of rooms 22 (22a, 22b) of the facility 10 may receive a second leg 18b of the AC power, and an outlet 28 (e.g., 240V receptacle) in the second set of rooms 22 may receive the second leg 18b and a third leg 18c of the AC power. In addition, outlets 26 in a third set of rooms 24 (24a, 24b) of the facility 10 may receive the third leg 18c of the AC power.

The voltage legs 18 may be derived from any variation of single and multi-phase power systems at any frequency. For example, three-phase power supply configurations such as, for example, wye configurations (e.g., 208Y/120, 480Y/277, 208Y/120 5-wire), delta configurations (e.g., 3-wire delta, 4-wire delta, 240V split phase delta), and so forth may be supported. Although three legs 18 are shown, other distribution arrangements such as, for example, one leg arrangements (e.g., single phase 120 Vac or 240 Vac), two leg arrangements (e.g., split-phase 120/240), may be used. Neutral and/or ground connections are not shown to simplify the illustration.

In the illustrated example, a first voltage sensor 30 is plugged into the outlet 26 in the first set of rooms 20, wherein the first voltage sensor 30 generates a first set of voltage samples corresponding to the line voltage of the first leg 18a. Similarly, a second voltage sensor 32 may be plugged into the outlet 26 in the second set of rooms 22 to obtain a second set of voltage samples corresponding to the line voltage of the second leg 18b and a third voltage sensor 34 may be plugged into the outlet 26 in the third set of rooms 24 to obtain a third set of voltage samples corresponding to the line voltage of the third leg 18c.

As will be discussed in greater detail, a time domain analysis may be conducted on the first set of voltage samples from the first voltage sensor 30, the second set of voltage samples from the second sensor 32 and/or the third set of voltage samples from the third voltage sensor 34. Additionally, the time domain analysis may enable classification and/or identification of electrical system loads such as, for example, a load 36 and a classification system 38 in the room 20b, a load 40 in the room 22a, a load 42 in the room 24a, etc. Moreover, the time domain analysis may be used to distinguish two or more of the loads 36, 40, 42 and/or the classification system 38 from one another. Using time domain analysis to classify, identify and/or distinguish between loads may substantially simplify the load classification process, which may in turn lead to reduced processing overhead, power consumption, network bandwidth usage, and so forth. In addition, using voltage sensors on a per leg basis may obviate safety concerns, reduce costs, eliminate installation related shutdowns, and so forth.

Figure 2:
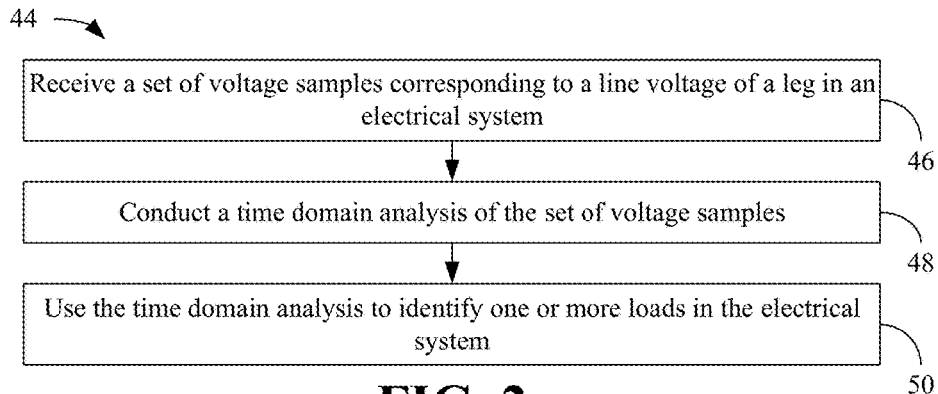
FIG. 2 is a flowchart of an example of a method of identifying loads according to an embodiment.

FIG. 2 shows a method 44 of identifying loads. The method 44 may be implemented via a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 46 provides for receiving (e.g., wirelessly) a set of voltage samples corresponding to a line voltage of a leg in an electrical system. The set of voltage samples may be received from, for example, a voltage sensor plugged into an outlet connected to the leg. The samples may be obtained from an amplitude modulated line voltage waveform (e.g., 120 Hz, 100 Hz sine wave) at a sampling rate of, for example, 4.8 KHz. A time domain analysis may be conducted on the set of voltage samples at block 48. In general, complex loads with predictable state changes may impact the peak-to-peak amplitude of the sampled waveform at particular time intervals. Storing these state changes and understanding the predicted behaviors of these state changes in the time domain may increase the ability to identify particular event patterns. Furthermore, using multiple, simultaneous views of the peak-to-peak amplitude changes (e.g., per voltage leg) in a particular time period may aid in the identification of the event. As a result, unique, repeatable patterns on different voltage legs of an electrical system may be used to identify electrical loads. Thus, conducting the time domain analysis may involve detecting an event with respect to one or more loads and classifying the event, wherein the time domain analysis may be used at block 50 to identify the loads in the electrical system.

Figures 3A, 3B:
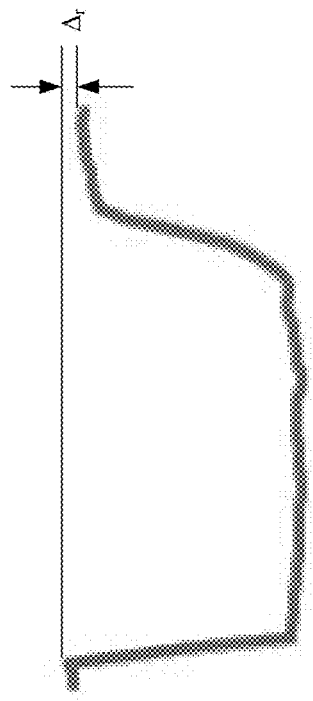
FIG. 3A is an illustration of an example of a table of known line voltage signatures for a plurality of loads according to an embodiment.
FIG. 3B is an enlarged view of an example of a voltage disturbance according to an embodiment.

Events may be classified with respect to features such as, for example, cross correlation, shape magnitude, transient amplitude, transient duration, run delta, standard deviation, and so forth. For example, FIG. 3A shows a table 52 of known line voltage signatures that may be used to detect, identify and distinguish between loads in an electrical system. Information such as the table 52 may be developed on a global and/or system-specific basis, averaged over time and used to determine whether an observed event corresponds to a particular load in an electrical system. In general, the difference (e.g., Euclidean distance) between the samples from a particular event and voltage line data for known loads may be determined in order to identify a match between the event and a known load. In the illustrated example, loads such as an HVAC (heating, ventilation, air conditioning) compressor, a two stage resistive load (e.g., oven with multiple heating elements), a resistive and inductive load (e.g., clothes dryer), and a refrigeration load are characterized in terms of transient amplitude 54, transient duration 56, transient shape 58, and the number of legs 60 involved.

Transient Amplitude

When a load activates (e.g., turns on), a brief disturbance (e.g., transient) in the line voltage may occur. The amplitude of that disturbance may be quantified and used as a feature to compare voltage samples for a detected event to known voltage signatures for particular loads. In the illustrated example, the transient amplitude for an HVAC compressor is relatively large and the transient amplitudes for a two stage resistive load and a resistive/inductive load are relatively small.

Transient Duration

The duration of the line voltage disturbance may also be quantified and used as a feature to compare voltage samples for a detected event to known voltage signatures for particular loads. In the illustrated example, the transient duration for a two stage resistive load is relatively long and the transient duration for a resistive/inductive load is relatively short.

Cross Correlation

The shape of the line voltage event may be quantified in a number of different ways. In one approach, a cross correlation may be determined by normalizing the voltage samples for the detected event and determining the difference (e.g., Euclidean distance) between the normalized samples and line voltage signatures for known loads. The cross correlation may therefore provide a comparison between the shape of the event and the shape of the signature. Thus, two line voltage disturbances having the same shape but different magnitudes may result in a relatively high match probability under the cross correlation feature. In this regard, the cross correlation may be independent of the physical location of the line voltage sensors within the facility (e.g., connected outlet position relative to the loads).

Shape Magnitude

Another approach to quantifying the shape of a line voltage event may be to determine the shape magnitude, which may indicate the difference (e.g., Euclidean distance) between non-normalized voltage samples for the detected event and line voltage signatures for known loads. The shape magnitude may therefore provide a comparison between the absolute values of the event shape and the signature shape. Thus, two line voltage disturbances having the same shape but different magnitudes may result in a relatively low match probability under the shape magnitude feature. In this regard, the shape magnitude may be a function of the physical location of the line voltage sensors within the facility (e.g., connected outlet position relative to the loads).

Run Delta

FIG. 3B shows an enlarged view of the line voltage signature shape for the HVAC compressor of the table 52 (FIG. 3A). The illustrated example demonstrates that the difference between the pre-event line voltage and the steady state line voltage after the load has turned on may represent a run delta ($\Delta_r$) feature. The run delta feature may therefore be used to compare the voltage samples for a detected event to known voltage signatures for particular loads.

Number of Legs

The number of legs impacted by the load may also be used as a comparison feature. For example, a load that is connected to a single voltage leg (e.g., single phase compressor) in a two-leg configuration might cause a disturbance on both legs—a primary disturbance on the connected leg and a reflection on the non-connected leg—wherein the two disturbances may be different from one another in terms of shape magnitude, transient amplitude, transient duration, etc. In such a case, both disturbances may be used as signatures for the load in question. Split phase loads (e.g., central air conditioners), on the other hand, may have similar disturbances on both legs.

Standard Deviation

In addition, the standard deviation may be determined for the voltage samples and the known voltage signatures. In such an approach, the amount of variation from the average line voltage during the disturbance may provide a useful metric for identifying load. In the example of FIG. 3A, the standard deviation for the HVAC compressor is relatively large and the standard deviation for the two stage resistive load is relatively small. The specific values provide and shapes illustrated are to facilitate discussion only, and may vary depending upon the circumstances.

Figure 4:
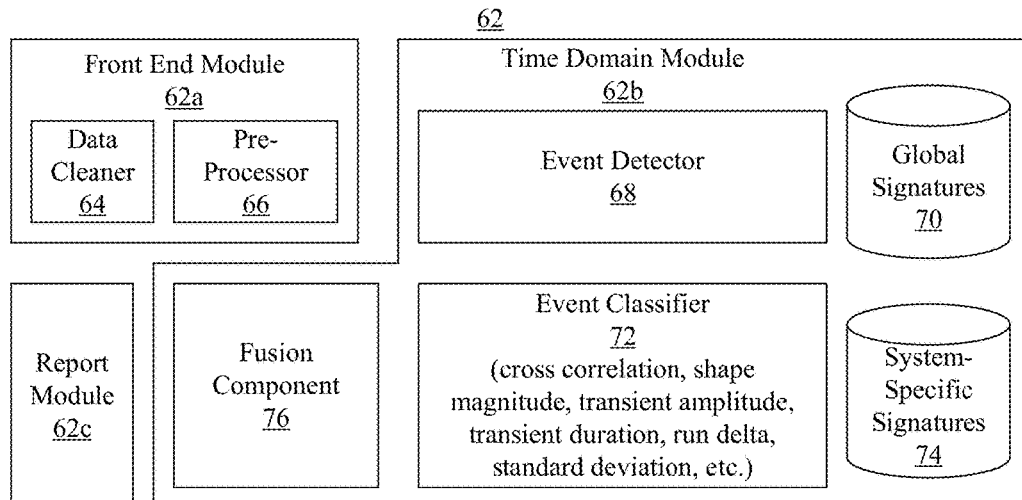
FIG. 4 is a block diagram of an example of a load classification logic architecture according to an embodiment.

FIG. 4 shows a load classification logic architecture 62 (62a-62c) that may be used to identify and distinguish between loads in an electrical system. The logic architecture 62 may generally implement one or more aspects of the method 44 (FIG. 2), already discussed. In the illustrated example, a front end module 62a receives a set of voltage samples corresponding to a line voltage of a leg in an electrical system. In one example, the voltage samples are received via a wireless data link. The front end module 62a may use a data cleaner 64 to ensure data conformity between samples, conduct element sizing, eliminate anomalies, correct wireless data packets, and so forth, in order to obtain clean, reliable, robust and consistent data. A pre-processor 66 may apply packet-level timestamps to the samples, interpolate between the samples (e.g., if there is missing data), apply precision timestamps to each sample, align data between phases/legs, and so forth.

The data from the pre-processor 66 may be provided to a time domain module 62b, which may use an event detector 68 to detect events with respect to loads in the electrical system. The event detector 68 may therefore use pre-buffer data to determine when a particular event begins so that consistent comparisons may be made between the event and known line voltage signatures. The event detector 68 may access a global signature database 70 that contains known line voltage data (e.g., signatures) for various loads. The global signature database 70 might be generated based on voltage data from different facilities and/or utility customers, wherein the signatures in the database 70 may provide a generic range of transient amplitudes and durations for which a known set of loads may exist.

Events detected by the event detector 68 may be provided to an event classifier 72. The event classifier 72 may use one or more features such as, for example, cross correlation, shape magnitude, transient amplitude, transient duration, run delta, standard deviation, etc., to identify the events. In particular, the event classifier 72 may compare the set of voltage samples for a particular event to known line voltage data from the global signature database 70 and/or a system-specific signature database 74. The system-specific signature database 74 may be generated based on voltage data from the particular facility in question, and may therefore provide detailed ranges of feature values for the loads in that facility. Of particular note is that the comparison may be conducted entirely in the time domain, which may be much less complex and processing intensive than frequency domain analysis. The features used by the event classifier 72 may be robust enough to enable the time domain module 62b to identify one or more loads in the electrical system, as well as distinguish two or more loads in the electrical system from one another.

The illustrated time domain module 62b also includes a fusion component 76 to combine time domain analysis results for a plurality of legs in the electrical system. For example, the fusion component 76 might combine primary disturbances on voltage legs connected to a load with secondary disturbances voltage legs that are not connected to the load, as already discussed. Additional, the fusion component 76 may take into consideration usage patterns (e.g., daytime, nighttime, weekday, weekend, seasonal, etc.) and/or device states (e.g., whether a load is already on or off), when combining and comparing data from multiple voltage legs. A report module 62c may generate one or more reports reflecting the results of the time domain analysis and transmit those reports to other entities and/or systems for further analysis (e.g., ground truth meter comparison), action, and so forth.

Figure 5:
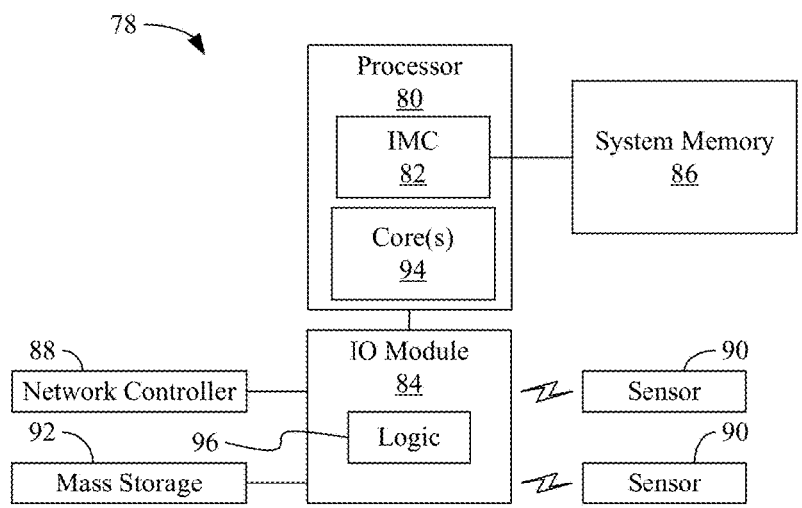
FIG. 5 is a block diagram of an example of a load classification system according to an embodiment.

Turning now to FIG. 5, a computing platform 78 is shown. The platform 78 may be part of a device having computing functionality (e.g., personal digital assistant/PDA, notebook computer, tablet computer, convertible tablet, desktop computer, cloud server), communications functionality (e.g., wireless smart phone), imaging functionality, media playing functionality (e.g., smart television/TV), or any combination thereof (e.g., mobile Internet device/MID). In the illustrated example, the platform 78 includes a processor 80, an integrated memory controller (IMC) 82, an input output (IO) module 84, system memory 86, a network controller 88, one or more line voltage sensors 90 and mass storage 92 (e.g., optical disk, hard disk drive/HDD, flash memory). In one example, the sensors 90 generate voltage samples and the platform 78 functions as a load classification system such as, for example, the load classification system 38 (FIG. 1).

The processor 80 may include a core region with one or several processor cores 94. The illustrated IO module 84, sometimes referred to as a Southbridge or South Complex of a chipset, functions as a host controller and communicates with the network controller 88, which could provide off-platform communication functionality for a wide variety of purposes such as, for example, cellular telephone (e.g., Wideband Code Division Multiple Access/W-CDMA (Universal Mobile Telecommunications System/UMTS), CDMA2000 (IS-856/IS-2000), etc.), WiFi (Wireless Fidelity, e.g., Institute of Electrical and Electronics Engineers/IEEE 802.11-2007, Wireless Local Area Network/LAN Medium Access Control (MAC) and Physical Layer (PHY) Specifications), 4G LTE (Fourth Generation Long Term Evolution), Bluetooth (e.g., IEEE 802.15.1-2005, Wireless Personal Area Networks), WiMax (e.g., IEEE 802.16-2004, LAN/MAN Broadband Wireless LANS), Global Positioning System (GPS), spread spectrum (e.g., 900 MHz), and other radio frequency (RF) telephony purposes. Other standards and/or technologies may also be implemented in the network controller 88, which may communicate wirelessly with the line voltage sensors 90. The IO module 84 may also include one or more wireless hardware circuit blocks to support such functionality. Although the processor 80 and IO module 84 are illustrated as separate blocks, the processor 80 and IO module 84 may be implemented as a system on chip (SoC) on the same semiconductor die.

The system memory 86 may include, for example, double data rate (DDR) synchronous dynamic random access memory (SDRAM, e.g., DDR3 SDRAM JEDEC Standard JESD79-3C, April 2008) modules. The modules of the system memory 86 may be incorporated into a single inline memory module (SIMM), dual inline memory module (DIMM), small outline DIMM (SODIMM), and so forth.

The illustrated IO module 84 includes logic 96 to receive a set of voltage samples corresponding to a line voltage of a leg in an electrical system, conduct a time domain analysis of the set of voltage samples, and use the time domain analysis to identify one or more loads in the electrical system. The time domain analysis may also be used to distinguish two or more loads in the electrical system from one another. The logic 96 may therefore function similarly to the logic architecture 62 (FIG. 4) and/or may implement one or more aspects of the method 44 (FIG. 2), already discussed. Moreover, the sensors 90 may function similarly to the sensors 34 (FIG. 1), already discussed.

ADDITIONAL NOTES AND EXAMPLES

Example 1 may include a load classification system comprising a sensor coupled to a leg in an electrical system, the sensor to generate a set of voltage samples corresponding to a line voltage of the leg, a front end module to receive the set of voltage samples, and a time domain module to conduct a time domain analysis of the set of voltage samples and use the time domain analysis to identify one or more loads in the electrical system. The time domain module may include an event detector to detect an event with respect to the one or more loads and an event classifier to classify the event with respect to one or more of a cross correlation, a shape magnitude, a transient amplitude, a transient duration, a run delta or a standard deviation.

Example 2 may include the load classification system of Example 1, wherein the time domain module is to use the time domain analysis to distinguish two or more loads in the electrical system from one another.

Example 3 may include the load classification system of Example 1, wherein the time domain module is to compare the set of voltage samples to known line voltage data from a global signature database to conduct the time domain analysis.

Example 4 may include the load classification system of Example 1, wherein the time domain module is to compare the set of voltage samples to known line voltage data from a system-specific signature database to conduct the time domain analysis.

Example 5 may include the load classification system of Example 1, wherein the time domain module further includes a fusion component to combine time domain analysis results for a plurality of legs in the electrical system.

Example 6 may include the load classification system of any one of Examples 1 to 5, wherein the sensor is to be coupled to an outlet of the electrical system.

Example 7 may include a method of classifying loads, comprising receiving a set of voltage samples corresponding to a line voltage of a leg in an electrical system, conducting a time domain analysis of the set of voltage samples, and using the time domain analysis to identify one or more loads in the electrical system.

Example 8 may include the method of Example 7, further including using the time domain analysis to distinguish two or more loads in the electrical system from one another.

Example 9 may include the method of Example 7, wherein conducting the time domain analysis includes detecting an event with respect to the one or more loads, and classifying the event with respect to one or more of a cross correlation, a shape magnitude, a transient amplitude, a transient duration, a run delta or a standard deviation.

Example 10 may include the method of Example 7, wherein conducting the time domain analysis includes comparing the set of voltage samples to known line voltage data from one or more of a global signature database or a system-specific signature database.

Example 11 may include the method of Example 7, further including combining time domain analysis results for a plurality of legs in the electrical system.

Example 12 may include the method of any one of Examples 7 to 11, wherein the set of voltage samples is received from a sensor coupled to an outlet of the electrical system.

Example 13 may include at least one computer readable storage medium comprising a set of instructions which, if executed by a computing system, cause the computing system to receive a set of voltage samples corresponding to a line voltage of a leg in an electrical system, conduct a time domain analysis of the set of voltage samples, and use the time domain analysis to identify one or more loads in the electrical system.

Example 14 may include the at least one computer readable storage medium of Example 13, wherein the instructions, if executed, cause a computing system to use the time domain analysis to distinguish two or more loads in the electrical system from one another.

Example 15 may include the at least one computer readable storage medium of Example 13, wherein the instructions, if executed, cause a computing system to detect an event with respect to the one or more loads, and classify the event with respect to one or more of a cross correlation, a shape magnitude, a transient amplitude, a transient duration, a run delta or a standard deviation to conduct the time domain analysis.

Example 16 may include the at least one computer readable storage medium of Example 13, wherein the instructions, if executed, cause a computing system to compare the set of voltage samples to known line voltage data from one or more of a global signature database or a system-specific signature database to conduct the time domain analysis.

Example 17 may include the at least one computer readable storage medium of Example 13, wherein the instructions, if executed, cause a computing system to combine time domain analysis results for a plurality of legs in the electrical system.

Example 18 may include the at least one computer readable storage medium of any one of Examples 13 to 17, wherein the set of voltage samples is to be received from a sensor coupled to an outlet of the electrical system.

Example 19 may include an apparatus to classify loads, comprising a front end module to receive a set of voltage samples corresponding to a line voltage of a leg in an electrical system, and a time domain module to conduct a time domain analysis of the set of voltage samples and use the time domain analysis to identify one or more loads in the electrical system.

Example 20 may include the apparatus of Example 19, wherein the time domain module is to use the time domain analysis to distinguish two or more loads in the electrical system from one another.

Example 21 may include the apparatus of Example 19, wherein the time domain module includes an event detector to detect an event with respect to the one or more loads, and an event classifier to classify the event with respect to one or more of a cross correlation, a shape magnitude, a transient amplitude, a transient duration, a run delta or a standard deviation.

Example 22 may include the apparatus of Example 19, wherein the time domain module is to compare the set of voltage samples to known line voltage data from one or more of a global signature database or a system-specific signature database to conduct the time domain analysis.

Example 23 may include the apparatus of Example 19, wherein the time domain module further includes a fusion component to combine time domain analysis results for a plurality of legs in the electrical system.

Example 24 may include the apparatus of any one of Examples 19 to 23, wherein the set of voltage samples is to be received from a sensor coupled to an outlet of the electrical system.

Example 25 may include an apparatus to classify loads, comprising means for performing the method of any one of Examples 7 to 12.

Thus, automatic and non-intrusive techniques described herein may enable the ability to identify and distinguish electrical loads turning on and off by analyzing AC line voltage variances caused by that activity. The voltage may be captured by placing an appropriate voltage sensor on the phase and/or leg of an electrical system in a facility. Since there is typically only one, two or three legs in a facility, techniques described herein may use only one, two or three voltage sensors to obtain voltage samples for an entire facility. Such an approach may eliminate any need for whole building current transformers or numerous in-line sensors (e.g., one for each load).

Indeed, predictive maintenance solutions may be significantly enhanced by monitoring trends over time with respect to specific loads (e.g., HVAC turning on too frequently). As a result, substantial cost savings may be achieved with regard to repair activities, equipment replacement, and so forth.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) evolve over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A load classification system comprising:
   one or more electrical outlet sensors, wherein when the one or more electrical outlet sensors are placed into an electrical outlet of one or more different rooms, the one or more electrical outlet sensors generate a set of voltage samples corresponding to a line voltage of a leg in an electrical system;
   a front end module to receive the set of voltage samples; and
   a time domain module to conduct a time domain analysis of the set of voltage samples and use the time domain analysis to classify and identify one or more loads in the electrical system with respect to each of the one or more different rooms, wherein the time domain module includes:
   an event detector to detect an event with respect to the one or more loads;
   an event classifier to classify the event with respect to one or more of a cross correlation, a shape magnitude, a transient amplitude, a transient duration, a run delta or a standard deviation, and to identify the one or more loads; and
   a fusion component to combine time domain analysis results for the one or more legs in the electrical system, wherein the fusion component combines primary disturbances on one or more legs that are connected to a load with secondary disturbances on one or more legs that are not connected to the load.

2. The load classification system of claim 1, wherein the time domain module is to use the time domain analysis to distinguish two or more loads in the electrical system from one another.

3. The load classification system of claim 1, wherein the time domain module is to compare the set of voltage samples to known line voltage data from a global signature database to conduct the time domain analysis.

4. The load classification system of claim 1, wherein the time domain module is to compare the set of voltage samples to known line voltage data from a system-specific signature database to conduct the time domain analysis.

5. A method comprising:
   receiving a set of voltage samples corresponding to a line voltage of one or more legs in an electrical system, wherein the voltage samples are received via one or more electrical outlet sensors when the one or more electrical outlet sensors are each placed in an electrical outlet of one or more different rooms;
   conducting a time domain analysis of the set of voltage samples; and
   using the time domain analysis to classify and identify one or more loads in the electrical system with respect to each of the one or more different rooms, wherein conducting the time domain analysis includes:
   detecting an event with respect to the one or more loads;
   classifying the event with respect to one or more of a cross correlation, a shape magnitude, a transient amplitude, a transient duration, a run delta or a standard deviation, and identifying the one or more loads; and
   combining time domain analysis results for the one or more legs in the electrical system, wherein combining the time domain analysis results includes combining primary disturbances on one or more legs that are connected to a load with secondary disturbances on one or more legs that are not connected to the load.

6. The method of claim 5, further including using the time domain analysis to distinguish two or more loads in the electrical system from one another.

7. The method of claim 5, wherein conducting the time domain analysis includes comparing the set of voltage samples to known line voltage data from one or more of a global signature database or a system-specific signature database.

8. At least one non-transitory computer readable storage medium comprising a set of instructions which, if executed by a computing system, cause the computing system to:
receive a set of voltage samples corresponding to a line voltage of one or more legs in an electrical system, wherein the voltage samples are received from one or more electrical outlet sensors when the one or more electrical outlet sensors are each placed in an electrical outlet of one or more different rooms;
conduct a time domain analysis of the set of voltage samples; and
use the time domain analysis to classify and identify one or more loads in the electrical system with respect to each of the one or more different rooms, wherein conducting the time domain analysis further causes the computing system to:
detect an event with respect to the one or more loads; and
classify the event with respect to one or more of a cross correlation, a shape magnitude, a transient amplitude, a transient duration, a run delta or a standard deviation, and identify the one or more loads; and
combine time domain analysis results for the one or more legs in the electrical system, wherein combining the time domain analysis results includes combining primary disturbances on one or more legs that are connected to a load with secondary disturbances on one or more legs that are not connected to the load.

9. The at least one non-transitory computer readable storage medium of claim 8, wherein the instructions, if executed, cause a computing system to use the time domain analysis to distinguish two or more loads in the electrical system from one another.

10. The at least one non-transitory computer readable storage medium of claim 8, wherein the instructions, if executed, cause a computing system to compare the set of voltage samples to known line voltage data from one or more of a global signature database or a system-specific signature database to conduct the time domain analysis.

11. An apparatus comprising:
a front end module to receive a set of voltage samples corresponding to a line voltage of one or more legs in an electrical system, wherein the voltage samples are received via one or more electrical outlet sensors when the one or more electrical outlet sensors are each placed in an electrical outlet of one or more different rooms; and
a time domain module to conduct a time domain analysis of the set of voltage samples and use the time domain analysis to classify and identify one or more loads in the electrical system with respect to each of the one or more different rooms, wherein the time domain module includes:
an event detector to detect an event with respect to the one or more loads;
an event classifier to classify the event with respect to one or more of a cross correlation, a shape magnitude, a transient amplitude, a transient duration, a run delta or a standard deviation, and to identify the one or more loads; and
a fusion component to combine time domain analysis results for the one or more legs in the electrical system, wherein the fusion component combines primary disturbances on one or more legs that are connected to a load with secondary disturbances on one or more legs that are not connected to the load.

12. The apparatus of claim 11, wherein the time domain module is to use the time domain analysis to distinguish two or more loads in the electrical system from one another.

13. The apparatus of claim 11, wherein the time domain module is to compare the set of voltage samples to known line voltage data from one or more of a global signature database or a system-specific signature database to conduct the time domain analysis.

\* \* \* \* \*